United States Patent …

(12) United States Patent
Tseng et al.

(10) Patent No.: US 11,598,806 B2
(45) Date of Patent: Mar. 7, 2023

(54) TEST APPARATUS AND TEST METHOD TO A MEMORY DEVICE

(71) Applicant: NANYA TECHNOLOGY CORPORATION, New Taipei (TW)

(72) Inventors: Yu-Wei Tseng, New Taipei (TW); Chih-Ming Chang, Taoyuan (TW); Wan-Chun Fang, Taoyuan (TW); Jui-Chung Hsu, Pingtung County (TW); Chun-Hsi Li, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 163 days.

(21) Appl. No.: 17/155,043

(22) Filed: Jan. 21, 2021

(65) Prior Publication Data

US 2022/0229109 A1    Jul. 21, 2022

(51) Int. Cl.
*G01R 31/317*    (2006.01)

(52) U.S. Cl.
CPC ... *G01R 31/31721* (2013.01); *G01R 31/3172* (2013.01)

(58) Field of Classification Search
None
See application file for complete search history.

(56) References Cited

U.S. PATENT DOCUMENTS

| | | | |
|---|---|---|---|
| 7,737,715 B2* | 6/2010 | Tilbor | G01R 31/2841 324/762.02 |
| 11,320,480 B1* | 5/2022 | Gaoiran | G01R 31/2849 |
| 2019/0164851 A1* | 5/2019 | Yoo | G01R 31/2879 |
| 2019/0378590 A1* | 12/2019 | Joo | G01R 31/31905 |

FOREIGN PATENT DOCUMENTS

TW    201925771 A    7/2019

* cited by examiner

*Primary Examiner* — Jermele M Hollington
(74) *Attorney, Agent, or Firm* — CKC & Partners Co., LLC

(57) ABSTRACT

A test system is disclosed. The test system includes a tester, a first voltage stabilization circuit, and a device under test (DUT). The tester generates a first operational voltage and a control signal. The first voltage stabilization circuit transmits a second operational voltage, associated with the first operational voltage, to a socket board. The DUT operates with the second operational voltage received through the socket board. The first voltage stabilization circuit is further configured to control, according to the control signal, the second operational voltage to have a first voltage level when the DUT is operating.

12 Claims, 5 Drawing Sheets

TEST APPARATUS AND TEST METHOD TO A MEMORY DEVICE

BACKGROUND

Description of Related Art

Low power double data rate memory (LPDDR) has been widely utilized in mobile devices for better power performance. This form of memory operates at relatively smaller voltages as opposed to the more traditional operation voltage, for example, 2.5 volts. In some approaches, while performing a high speed test, for example, in read operation, to LPDDR devices, an output strobe (pass) window is narrowed due to an operational voltage drop which is caused by a promptly rising required (read/write) current in the LPDDR devices.

SUMMARY

One aspect of the present disclosure is to provide a test system. The test system includes a tester, a first voltage stabilization circuit, and a device under test (DUT). The tester generates a first operational voltage and a control signal. The first voltage stabilization circuit transmits a second operational voltage, associated with the first operational voltage, to a socket board. The DUT operates with the second operational voltage received through the socket board. The first voltage stabilization circuit is further configured to control, according to the control signal, the second operational voltage to have a first voltage level when the DUT is operating.

Another aspect of the present disclosure is to provide a method of operating a device under test (DUT) with a first operational voltage; comparing, by a first comparison circuit, a voltage level of the first operational voltage with a first initial voltage; and when the voltage level of the first operational voltage is different from the first initial voltage, adjusting, by a first adjustment circuit, the voltage level of the first operational voltage to have the first initial voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The spirit of the present disclosure will be discussed in the following drawings and detailed description, and those of ordinary skill in the art will be able to change and modify the teachings of the present disclosure without departing from the spirit and scope of the present disclosure.

It should be understood that, in this document and the following claims, when an element is referred to as being "connected" or "coupled" to another element, it can be directly connected or coupled to another element, or there may be an intervening component. In contrast, when an element is referred to as being "directly connected" or "directly coupled" to another element, there is no intervening element. In addition, "electrically connected" or "connected" may also be used to indicate that two or more elements cooperate or interact with each other.

It should be understood that, in this document and the following claims, the terms "first" and "second" are to describe the various elements. However, these elements should not be limited by these terms. These terms are used to distinguish one element from another. For example, a first element may be termed a second element. Similarly, a second element may be termed a first element without departing from the spirit and scope of the embodiments.

It should be understood that, in this document and the following claims, the terms "include," "comprise," "having" and "has/have" are used in an open-ended fashion, and thus should be interpreted to mean "include, but not limited to."

It should be understood that, in this document and the following claims, the term "and/or" includes any and all combinations of one or more of the associated listed items.

It should be understood that, in this document and the following claims, Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
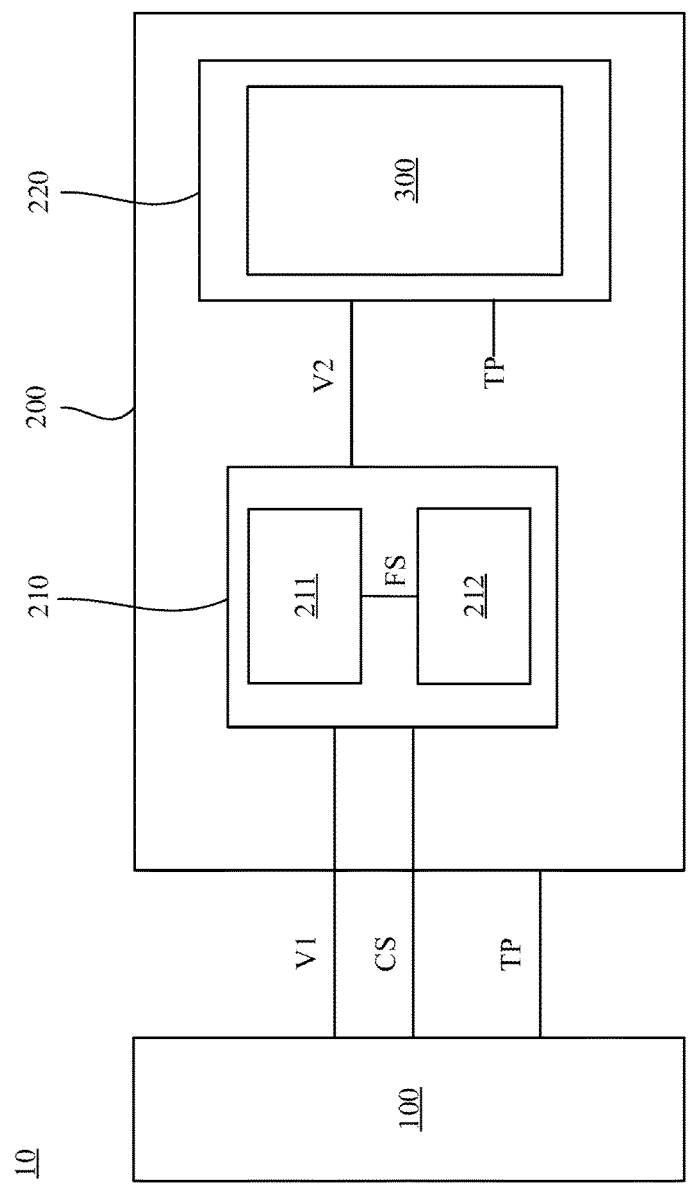
FIG. 1 is a schematic diagram of a test system, in accordance with some embodiments of the present disclosure.

Reference is now made to FIG. 1. FIG. 1 is a schematic diagram of a test system 10, in accordance with some embodiments of the present disclosure. For illustration, the test system 10 includes a tester 100 and a test interface board 200. In some embodiments, the test system 10 is implemented by an auto test equipment (ATE) which automatically tests a device under test (DUT) 300. The tester 100 includes, for example, a microcomputer or a microprocessor based system. As shown in FIG. 1, the tester 100 is electrically connected to the test interface board 200 and configured to generate an operational voltage V1, a control signal CS, and a test pattern TP to the test interface board 200 for testing the DUT 300. In some embodiments, the tester 100 includes a programmable power supply (PPS, not shown) or multiple power supplies (not shown) to generate the operational voltage V1.

For illustration, the test system 10 further includes a voltage stabilization circuit 210 and a device socket board 220. In some embodiments, the DUT 300 is mounted in a socket (not shown) of the device socket board 220. The voltage stabilization circuit 210 and the device socket board 220 are integrated in the test interface board 200. In some embodiments, the device socket board 220 is implemented by a device specific adaptor (DSA) and designed according to a type of the DUT 300. When a type of the DUT 300 changes, the device socket board 220 is replaced with a socked board corresponding to the changed type of the DUT 300. Further, the device socket board 220 includes at least one test module (not shown).

In some embodiments, the tester 100 accesses an external server (not shown) through, for example, a PCI interface (not shown). The external server provides a desired (or alternatively, predetermined) user interface to provide an environment allowing a user to create a test program suitable for characteristics of the DUT 300 to be tested. Further, the server provides a user interface to transmit the test program to the tester 100 and to receive a test result from the tester 100 to analyze the test result. In some embodiments, the tester 100 compares an output of the DUT 300 with an expected value to determine an error of the DUT 300. In some embodiments, the server is a processing device, e.g., a personal computer, a desk top device, a portable device, a microprocessor, a microprocessor based or programmable consumer electronic device, a mini-computer, a main frame computer, and/or a personal mobile computing device, but example embodiments are not limited thereto.

With continued reference to FIG. 1, in operation, the voltage stabilization circuit 210 and the device socket board 220 are configured to transmit signals through the test interface board 200. For example, while testing, the tester 100 inputs the test pattern TP to the DUT 300 through the device socket board 220 of the test interface board 200. The tester 100 also transmits the control signal CS and the operational voltage V1 to the test interface board 200, and the voltage stabilization circuit 210 is configured to transit an operational voltage V2, associated with the operational voltage V1, to the device socket board 220. Accordingly, the DUT 300 is configured to operate with the operational voltage V2 received through the device socket board 220. When the DUT 300 is operating in the testing, the voltage stabilization circuit 210 is further configured to control, according to the control signal CS, the operational voltage V2 to have a certain voltage level.

As mentioned above, in some embodiments, the voltage stabilization circuit 210 controls the operational voltage V2 to have the voltage level which equals to a voltage level of the operational voltage V1. For instance, the DUT 300 is a low power double data rate memory (LPDDR) device and a high speed test, for example, 3200 Mbps, is performed to the DUT 300. The tester 100 generates the operational voltage V1 being about 1.14 Volts to the voltage stabilization circuit 210 through the test interface board 200, and the voltage stabilization circuit 210 further transmits the operational voltage V2 being about 1.14 Volts to the DUT 300 through the device socket board 220 of the test interface board 200.

Furthermore, in some embodiments, the voltage stabilization circuit 210 is further configured to compare the operational voltage V2 with an initial voltage indicated by the control signal CS, and configured to adjust, in response to the comparison, the voltage level of the operational voltage V2 to have the voltage level which equals to the operational voltage V1. For example, as aforementioned embodiments, the control signal CS indicates that the initial voltage is about 1.14 Volts. Accordingly, the voltage stabilization circuit 210 compares the operational voltage V2 with the initial voltage. When the voltage level of the operational voltage V2 is different from the initial voltage, for example, the initial voltage being about 1.12 Volts, in response to the comparison, the voltage stabilization circuit 210 adjusts the voltage level of the operational voltage V2 to be about 1.14 Volts.

For illustration, the voltage stabilization circuit 210 includes a comparison circuit 211 and an adjustment circuit 212, as shown in FIG. 1. In some embodiments, the comparison circuit 211 is configured to compare the operational voltage V2 with the initial voltage indicated by the control signal CS and configured to generate a feedback signal FS to the adjustment circuit 212. The adjustment circuit 212 is configured to adjust, according to the feedback signal FS, the voltage level of the operational voltage V2 to have a voltage level of the initial voltage. For example, when the operational voltage V2 equals to the initial voltage, the feedback signal disables the adjustment circuit 212. On the contrary, when the operational voltage V2 (i.e., about 1.12 Volts) is smaller than the initial voltage (i.e., about 1.14 Volts), the feedback signal FS is a logic signal to enable the adjustment circuit 212. The adjustment circuit 212 pulls up, accordingly to the feedback signal, the voltage level of the operational voltage V2 from about 1.12 Volts to about 1.14 Volts. Alternatively stated, with the configurations of the comparison circuit 211 and the adjustment circuit 212 in the voltage stabilization circuit 210, the variations of the operational voltage V2 received by the DUT 300 is compensated.

In some embodiments, the comparison circuit 211 and the adjustment circuit 212 include amplifier(s), transistors, or other suitable active components. In various embodiments, the voltage stabilization circuit 210 is implemented by a voltage regulator.

In some approaches, when a robust test of repetitious writing and reading operations is performed to a device under test as the LPDDR device, the DUT demands a markedly increased current for operation in a short period of time and it induces a voltage drop of an operational voltage (i.e., one corresponding to the voltage VDD2 in a memory device). Therefore, in some embodiments, an output strobe pass window of the memory device is narrowed accordingly. For example, when the operational voltage VDD2 is about 1.14 Volts, the output strobe pass window is about 125 picoseconds (i.e., the memory device operates successfully with the configurations of the operational voltage VDD2 being 1.14 Volts and the strobe time ranging from 0.325 ns to 0.45 ns). However, when the operational voltage VDD2 declines to about 1.13 Volts, the output strobe pass window becomes about 100 picoseconds (i.e., the memory device operates successfully with the configurations of the operational voltage VDD2 being 1.13 Volts and the strobe time ranging from 0.325 ns to 0.425 ns). Moreover, when the operational voltage VDD2 declines to about 1.11 Volts, the output strobe pass window becomes about 25 picoseconds (i.e., the memory device operates successfully with the configurations of the operational voltage VDD2 being 1.11 Volts and the strobe time ranging from 0.325 ns to 0.350 ns).

Compared with some approaches, the voltage stabilization circuit 210 compensates the voltage drop of the operational voltage V2. Accordingly, with the configurations of the present disclosure, the output strobe pass window maintains the same during robust testing, without suffering any loss.

Moreover, in some embodiments, based on experimental results, the output strobe pass window of a LPDDR device, operating with a speed of about 3200 Mbps and with the voltage stabilization circuit 210 of the present disclosure, is about 160 picoseconds, whereas that of a LPDDR without the voltage stabilization circuit 210 is about 130 picoseconds. Accordingly, with the configurations of the present disclosure, the output strobe pass window is improved at about 23% (i.e., (160−130)/130).

In various embodiments, based on experimental results, the output strobe pass window of a LPDDR device, operating with a speed of about 4267 Mbps and with the voltage stabilization circuit 210 of the present disclosure, is about 70 picoseconds, whereas a LPDDR without the voltage stabilization circuit 210 fails to operate. Accordingly, with the configurations of the present disclosure, the output strobe pass window is open at the speed of about 4267 Mbps.

The configurations of FIG. 1 and values of operational voltages, speed, and the output strobe pass window are given for illustrative purposes. Various implements are within the contemplated scope of the present disclosure.

Figure 2:
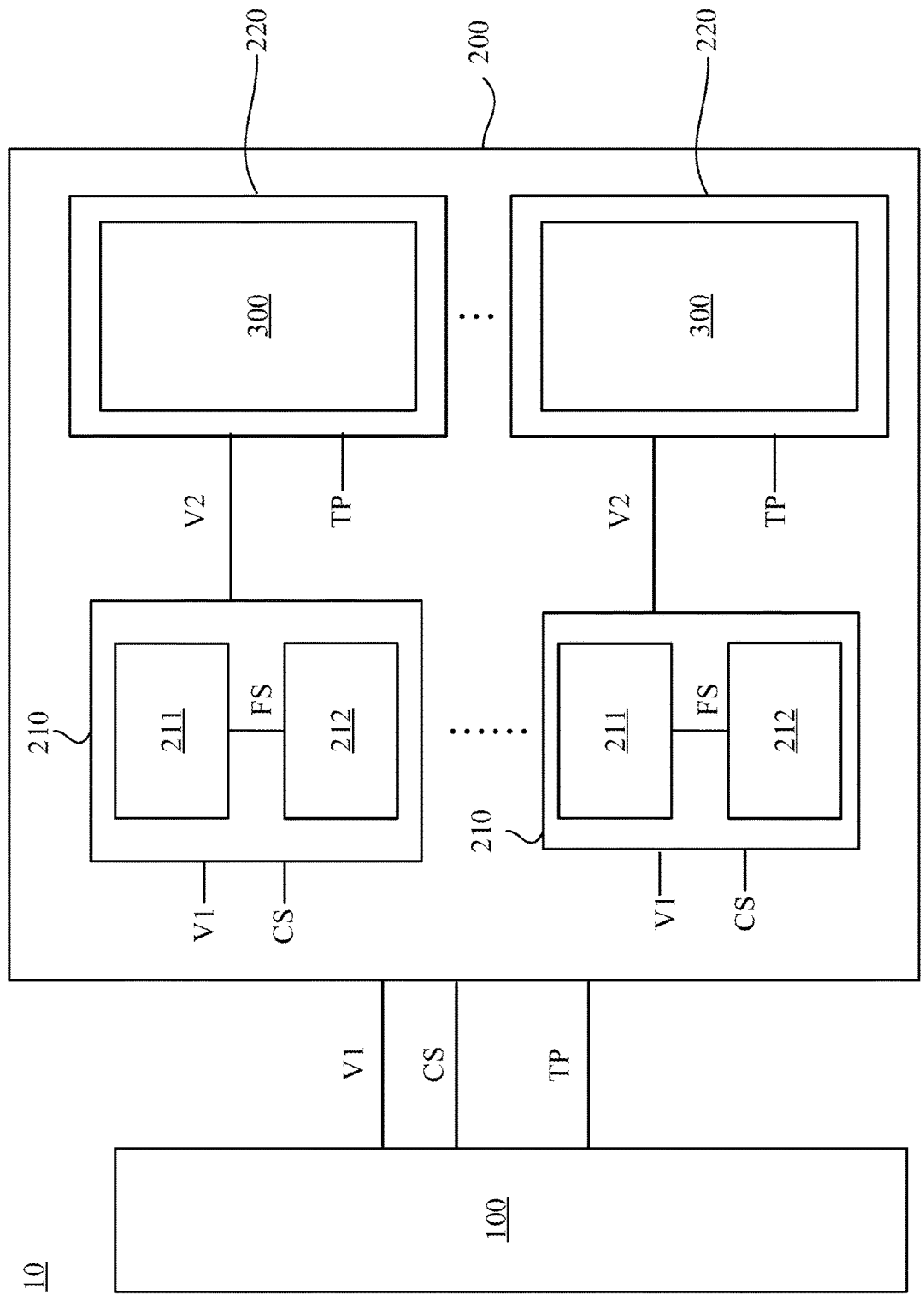
FIG. 2 is a schematic diagram of the test system in FIG. 1, in accordance with another embodiment of the present disclosure.

Reference is now made to FIG. 2. FIG. 2 is a schematic diagram of the test system 10 in FIG. 1, in accordance with another embodiment of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity.

Compared with FIG. 1, the test system 10 further includes multiple voltage stabilization circuits 210 and multiple device socket boards 220 coupled to various DUT 300. In some embodiments, the DUTs 300 are tested in the same batch with the same test pattern TP and operate in accordance with the operational voltage V2, as shown in FIG. 2.

The configurations of FIG. 2 are given for illustrative purposes. Various implements are within the contemplated scope of the present disclosure.

Figure 3:
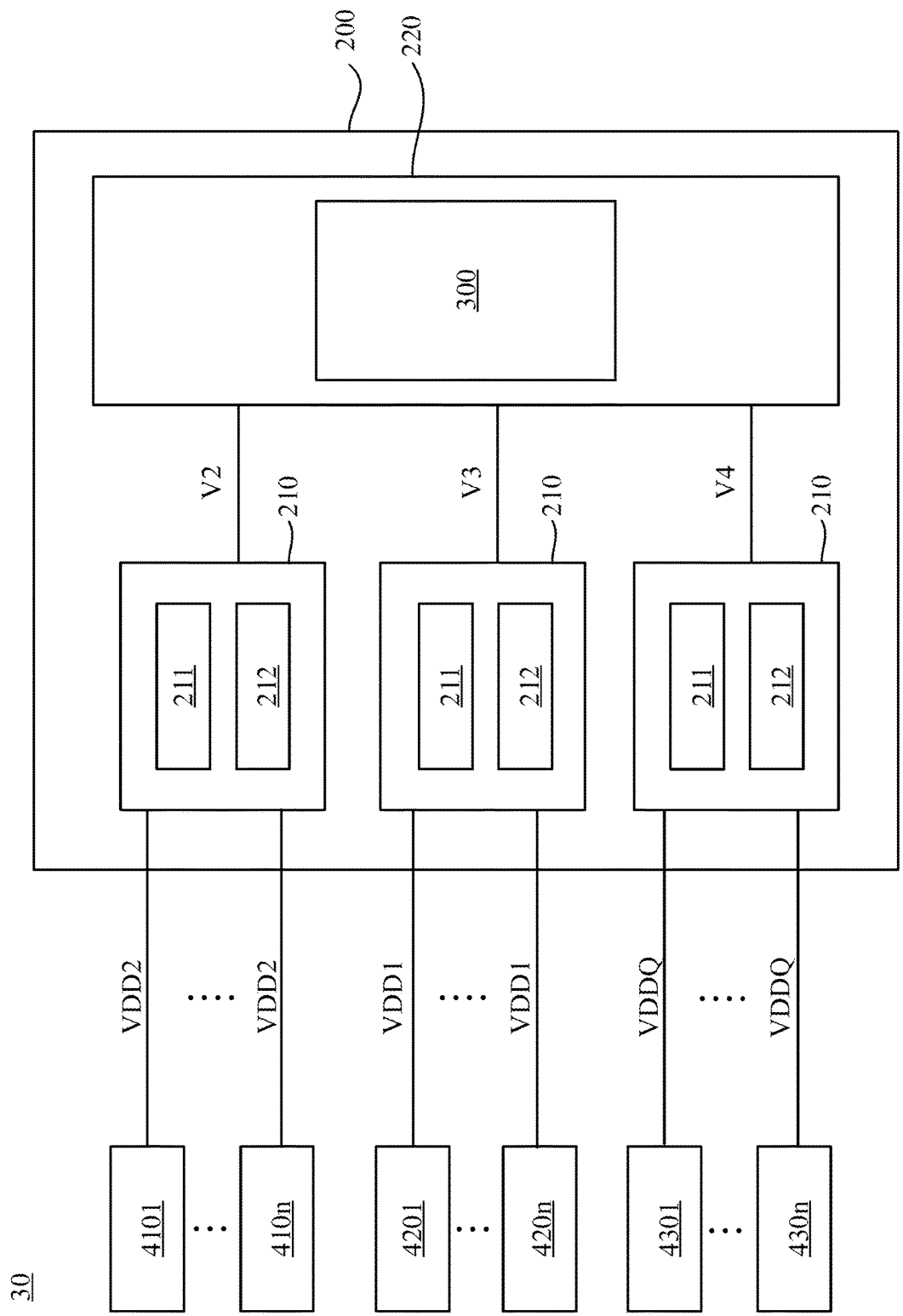
FIG. 3 is a schematic diagram of a test system, in accordance with some embodiments of the present disclosure.

Reference is now made to FIG. 3. FIG. 3 is a schematic diagram of a test system 30, in accordance with some embodiments of the present disclosure. With respect to the embodiments of FIGS. 1-2, like elements in FIG. 3 are designated with the same reference numbers for ease of understanding.

As shown in FIG. 3, compared with FIG. 2, the test system 30 includes power supplies 4101-410n, 4201-420n, and 4301-430n. For illustration, the power supplies 4101-410n are coupled in parallel and configured to generate an operational voltage VDD2 to a first circuit of the voltage stabilization circuits 210. The first circuit of the voltage stabilization circuits 210, correspondingly, transmits the operational voltage V2 to the DUT 300. Similarly, the power supplies 4201-420n are coupled in parallel and configured to generate an operational voltage VDD1 to a second circuit of the voltage stabilization circuits 210. The second circuit of the voltage stabilization circuits 210, correspondingly, transmits the operational voltage V3 to the DUT 300. The power supplies 4301-430n are coupled in parallel and configured to generate an operational voltage VDDQ to a third circuit of the voltage stabilization circuits 210. The third circuit of the voltage stabilization circuits 210, correspondingly, transmits the operational voltage V4 to the DUT 300.

In some embodiments, the first circuit of the voltage stabilization circuits 210 is configured to transmit the operational voltage V2, associated with the operational voltage VDD2, to the DUT 300 through test interface board 200. The first circuit of the voltage stabilization circuits 210 is further configured to control the voltage level of the operational voltage V2 to be the same as the operational voltage VDD2. For illustration, the comparison circuit 211 in the first circuit of the voltage stabilization circuits 210 compares the operational voltage VDD2 with the voltage level of the operational voltage V2, and the adjustment circuit 212 of the voltage stabilization circuits 210 adjusts, in response to the comparison, the voltage level of the operational voltage V2 to a voltage level which equals to the operational voltage VDD2. The configurations of the second and third circuits of the voltage stabilization circuits 210 are similar to the first circuit of the voltage stabilization circuits 210. Hence, the repetitious descriptions are omitted here.

In some embodiments, the operational voltages VDD1, VDD2, and VDDQ are referred to as three operational voltages in LPDDR devices, in which the operational voltages VDD1 and VDD2 are power supply voltages for core circuits and the operational voltage VDDQ is power supply voltage for input/output interface. The operational voltages VDD1, VDD2, and VDDQ are known to a person having ordinary skill in the art. In some embodiments, the operational voltages VDD1, VDD2, and VDDQ are about 1.7 Volts, 1.1 Volts, and 1.1 Volts separately. Alternatively stated, at least two of the voltage stabilization circuits 210 are configured to transmit two operational voltages that are substantially different.

The configurations of FIG. 3 are given for illustrative purposes. Various implements are within the contemplated scope of the present disclosure. For example, in some embodiments, there is only one power supply for each voltage stabilization circuit 210 in the test system 30 in FIG. 3.

Figure 4:
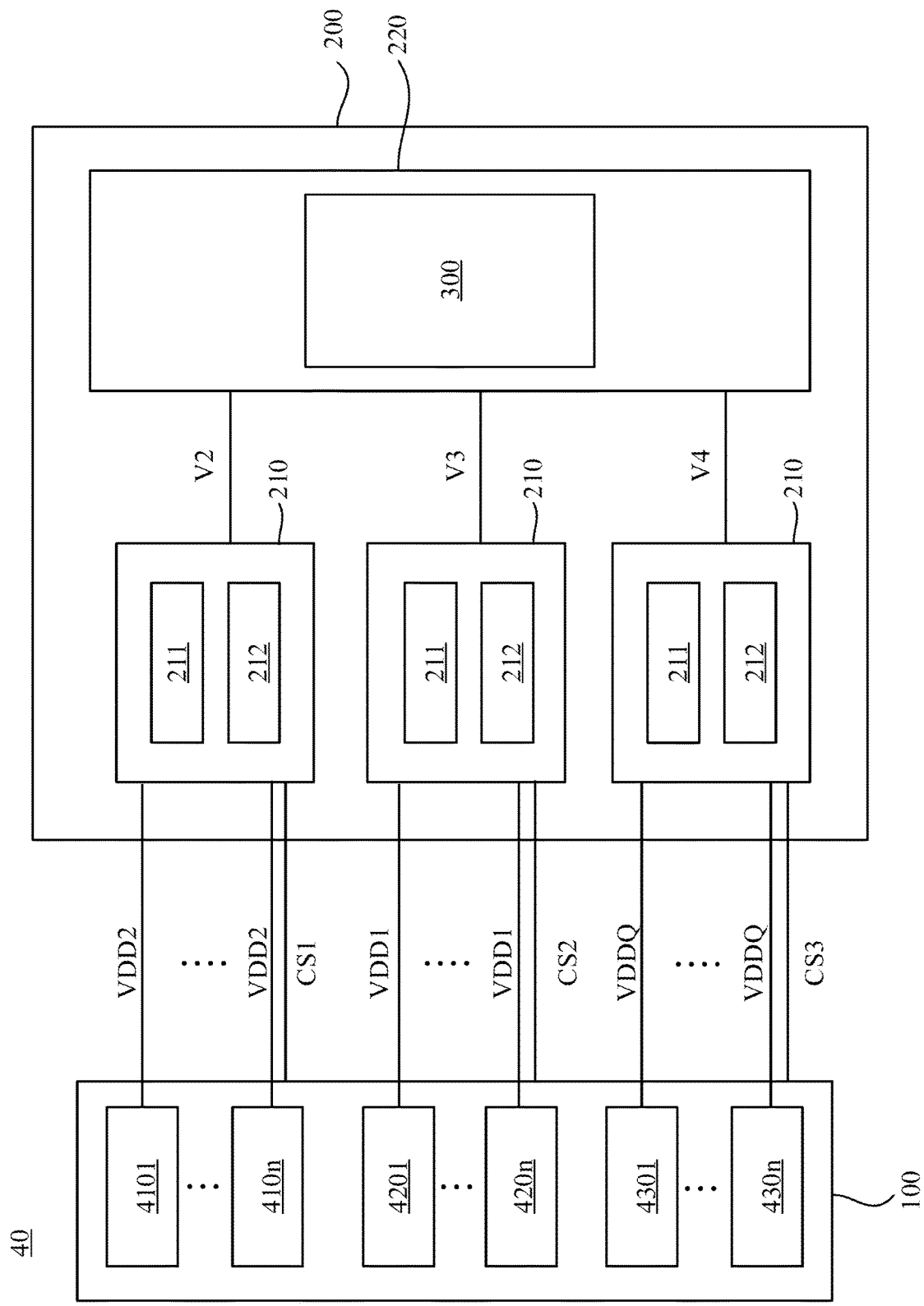
FIG. 4 is a schematic diagram of a test system, in accordance with some embodiments of the present disclosure.

Reference is now made to FIG. 4. FIG. 4 is a schematic diagram of a test system 40, in accordance with some embodiments of the present disclosure. With respect to the embodiments of FIGS. 1-3, like elements in FIG. 4 are designated with the same reference numbers for ease of understanding.

Compared with FIG. 3, the power supplies 4101-410n, 4201-420n, and 4301-430n are included in the tester 100. In some embodiments, each of the voltage stabilization circuits 210 in FIG. 4 is configured with respect to, for example, the voltage stabilization circuit 210 in FIG. 1. The control signals CS1-CS3 are configured with respect to, for example, the control signal CS in FIG. 1. Accordingly, the voltage stabilization circuits 210 in FIG. 4 are configured to transmit the operational voltages V2-V4 in response to the control signals CS1-CS3.

In some embodiments, based on experimental results, the output strobe pass window of a LPDDR device, operating with a speed of about 3200 Mbps and with the voltage stabilization circuit 210 for the operational voltages VDD2 and VDDQ, is about 170 picoseconds, whereas that of a LPDDR without the voltage stabilization circuit 210 is about 130 picoseconds. Accordingly, with the configurations of the present disclosure, the output strobe pass window is improved at about 30% (i.e., (170−130)/130).

In various embodiments, based on experimental results, the output strobe pass window of a LPDDR device, operating with a speed of about 4267 Mbps and with the voltage stabilization circuit 210 for the operational voltages VDD2 and VDDQ, is about 60 picoseconds, whereas a LPDDR without the voltage stabilization circuit 210 fails to operate. Accordingly, with the configurations of the present disclosure, the output strobe pass window is open at the speed of about 4267 Mbps.

The configurations of FIG. 4 are given for illustrative purposes. Various implements are within the contemplated scope of the present disclosure.

Figure 5:
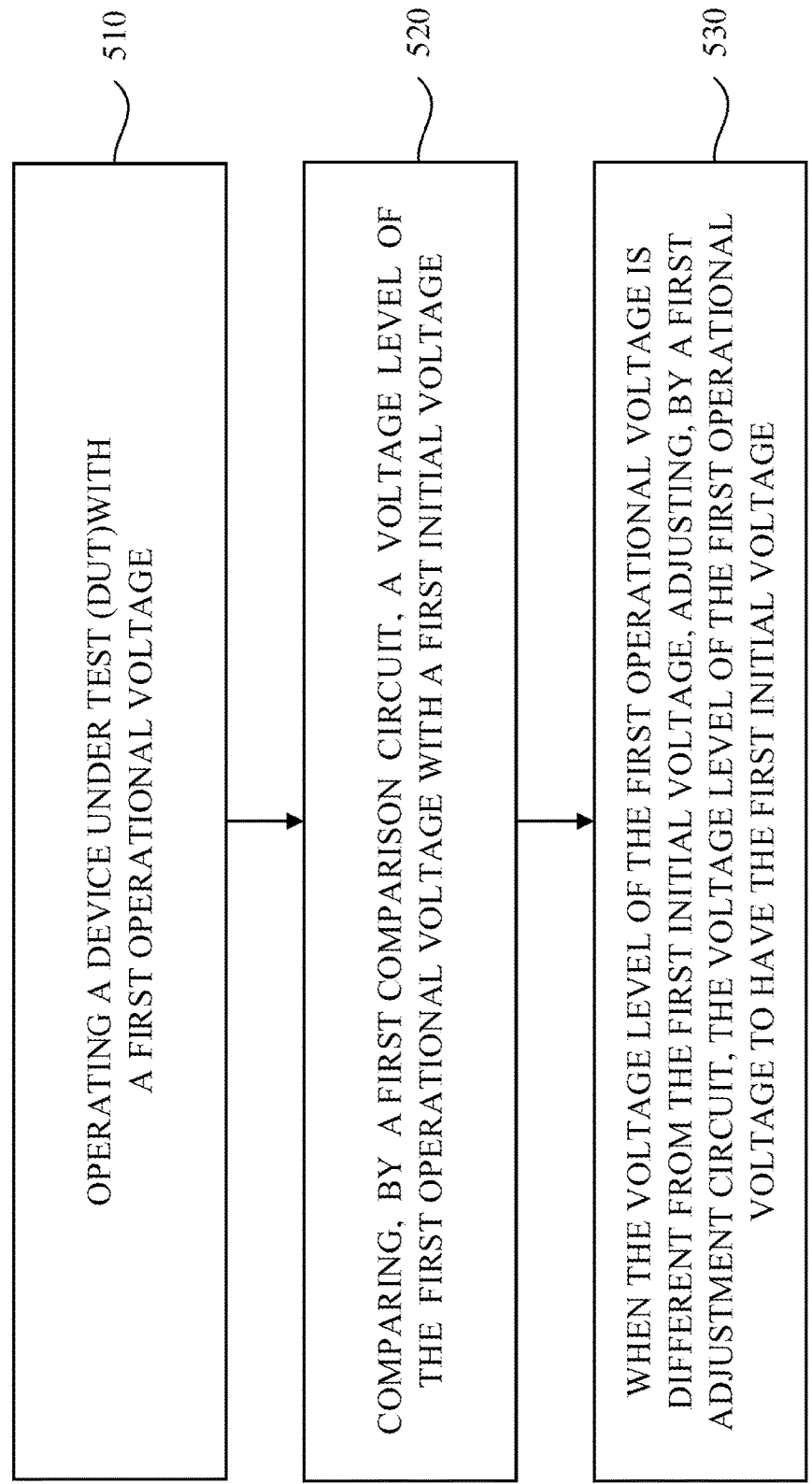
FIG. 5 is a flow chart of a method of operating a test system, in accordance with some embodiments of the present disclosure.

Reference is now made to FIG. 5. FIG. 5 is a flow chart of a test method 500 for the test system test system 10, 30, or 40, in accordance with some embodiments of the present disclosure. It is understood that additional operations can be provided before, during, and after the processes shown by FIG. 3, and some of the operations described below can be replaced or eliminated, for additional embodiments of the method. The order of the operations/processes may be interchangeable. Throughout the various views and illustrative embodiments, like reference numbers are used to designate like elements. The test method 500 will be discussed with reference to the test system 40 in FIG. 4.

In operation 510, the DUT 300 operates with the operational voltage V2 received through the device socket board 220 of the test interface board 200, as shown in FIG. 4.

In some embodiments, the test method 500 further includes operations of generating, by at least one of the power supplies 4101-410n, the operational voltage VDD2 to one of the voltage stabilization circuits 210 for generating the operational voltage V2. The voltage level of the operational voltage VDD2 equals to the initial voltage indicated by the control signal CS1.

In operation 520, the comparison circuit 211 in the voltage stabilization circuit 210 compares the voltage level of the operational voltage V2 with the initial voltage indicated by the control signal CS1.

In some embodiments, the test method 500 further includes generating, by the comparison circuit 211, the feedback signal FS in response to the comparison, to the adjustment circuit 212.

In operation 530, when the voltage level of the operational voltage V2 is different from the initial voltage (i.e., equal to the operational voltage VDD2), the adjustment circuit 212 adjusts the voltage level of the operational voltage V2 to have the initial voltage.

In some embodiments, the test method 500 further includes pulling up, by the adjustment circuit 212, the voltage level of the operational voltage V2 to have a voltage level of the operational voltage VDD2 when the voltage level of the operational voltage V2 is smaller than the initial voltage (i.e., equal to the operational voltage VDD2).

In some embodiments, the test method 500 further includes operating the DUT 300 with the operational voltage V3 different from the operation voltage V2, and includes controlling, by the voltage stabilization circuit 210, the voltage level of the operational voltage V3 to equal to another initial voltage (i.e., equal to the operational voltage VDD1) indicated by the control signal CS2. As shown in FIG. 4, another initial voltage is provided through the control signal CS2 by the tester 100 to the voltage stabilization circuit 210.

In some embodiments, the test method 500 further includes comparing, by the comparison circuit 211 in the voltage stabilization circuit 210, which receives the operational voltage VDD1, the voltage level of the operational voltage V3 with another initial voltage (i.e., equal to the operational voltage VDD1), and includes adjusting, in response to the comparison, by the adjustment circuit 212 the voltage level of the operational voltage V3 to have a voltage level of the operational voltage VDD1.

Any element in the claim should not be construed as a means of function, unless it is explicitly stated that the device is used to perform a particular function, or that the steps are used to perform a particular function.

Through the operations of the various embodiments above, the test system and the test method provided by the present disclosure stabilize operational voltages of low power memory devices under high speed testing and correspondingly offer wide output strobe pass window of the low power memory devices.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A test system, comprising:
    a tester configured to generate a first operational voltage and a control signal;
    a first voltage stabilization circuit configured to transmit a second operational voltage, associated with the first operational voltage, to a socket board; and
    a device under test (DUT) configured to operate with the second operational voltage received through the socket board,
    wherein the first voltage stabilization circuit comprises:
    a comparison circuit configured to compare the second operational voltage with an initial voltage indicated by the control signal, and to generate a feedback signal; and
    an adjustment circuit configured to pull up, according to the feedback signal, the voltage level of the second operational voltage to a first voltage level when the DUT is operating.

2. The test system of claim 1, wherein the first voltage level equals to a voltage level of the first operation voltage.

3. The test system of claim 1, further comprising:
    a test interface board electrically coupled to the tester, wherein the first voltage stabilization circuit and the socket board are integrated in the test interface board.

4. The test system of claim 1, further comprising:
    a plurality of first power supplies configured to generate the first operational voltage to the first voltage stabilization circuit;
    a second voltage stabilization circuit configured to transmit a third operational voltage to the DUT through the socket board; and
    a plurality of second power supplies configured to generate a fourth operational voltage to the second voltage stabilization circuit for generating the third operational voltage.

5. The test system of claim 4, wherein the second voltage stabilization circuit comprises:
    an adjustment circuit configured to adjust a voltage level of the third operational voltage to a second voltage level which equals to the fourth operational voltage.

6. The test system of claim 1, further comprising:
    a second voltage stabilization circuit configured to transmit a third operational voltage, associated with a fourth operational voltage received by the second voltage stabilization circuit, to the socket board, and configured to control a voltage level of the third operational voltage to be the same as the fourth operational voltage.

7. The test system of claim 1, wherein the DUT is a low power double data rate memory (LPDDR) device.

8. A test method, comprising:
    operating a device under test (DUT) with a first operational voltage;
    comparing, by a first comparison circuit comprised in a first voltage stabilization circuit, a voltage level of the first operational voltage with a voltage level of a first initial voltage;
    when the voltage level of the first operational voltage is different from the first initial voltage, adjusting, by a first adjustment circuit comprised in the first voltage stabilization circuit, the voltage level of the first operational voltage to the voltage level of the first initial voltage, generating, by the first comparison circuit, a feedback signal in response to the comparison, to the adjustment circuit; and pulling up, by the first adjustment circuit, the voltage level of the first operational voltage.

9. The test method of claim 8, further comprising:

generating, by at least one power supply, a second operational voltage to a voltage stabilization circuit for generating the first operational voltage, wherein a voltage level of the second operational voltage equals to the first initial voltage.

10. The test method of claim 8, further comprising:

operating the DUT with a second operational voltage different from the first operation voltage; and controlling, by a voltage stabilization circuit, a voltage level of the second operational voltage to equal to a second initial voltage, wherein the second initial voltage is provided by a tester to the voltage stabilization circuit.

11. The test method of claim 8, further comprising:

operating the DUT with a second operational voltage;

comparing, by a second comparison circuit, a voltage level of the second operational voltage with a second initial voltage different from the first initial voltage; and in response to the comparison, adjusting, by a second adjustment circuit, the voltage level of the second operational to have the second initial voltage.

12. The test method of claim 8, wherein adjusting the voltage level of the first operational voltage comprises:

when the voltage level of the first operational voltage is smaller than the first initial voltage, pulling up, by the first adjustment circuit, the voltage level of the first operational voltage.

* * * * *